United States Patent
Welty

(10) Patent No.: US 7,282,964 B2
(45) Date of Patent: Oct. 16, 2007

(54) CIRCUIT FOR DETECTING TRANSITIONS ON EITHER OF TWO SIGNAL LINES REFERENCED AT DIFFERENT POWER SUPPLY LEVELS

(75) Inventor: Mark B. Welty, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 8 days.

(21) Appl. No.: 11/239,194

(22) Filed: Sep. 29, 2005

(65) Prior Publication Data

US 2006/0267663 A1    Nov. 30, 2006

Related U.S. Application Data

(60) Provisional application No. 60/683,927, filed on May 25, 2005.

(51) Int. Cl.
 H03K 5/22 (2006.01)
 H03K 19/0175 (2006.01)
(52) U.S. Cl. .................. 327/63; 326/63; 327/333
(58) Field of Classification Search .............. 327/63, 327/65, 70, 333; 326/63, 68, 80–83
 See application file for complete search history.

(56) References Cited

U.S. PATENT DOCUMENTS

| | | | | |
|---|---|---|---|---|
| 4,560,890 A | * | 12/1985 | Masuda et al. | 327/65 |
| 6,414,053 B2 | * | 7/2002 | Fernandez et al. | 523/218 |
| 6,714,053 B2 | * | 3/2004 | Mohan | 327/65 |
| 6,750,696 B2 | * | 6/2004 | Shimada et al. | 327/333 |
| 6,819,159 B1 | * | 11/2004 | Lencioni | 327/333 |
| 6,858,623 B2 | * | 2/2005 | Bekkali et al. | 514/304 |

* cited by examiner

*Primary Examiner*—Quan Tra
*Assistant Examiner*—Rey Aranda
(74) *Attorney, Agent, or Firm*—Alan K. Stewart; W. James Brady; Frederick J. Telecky, Jr.

(57) ABSTRACT

A transition detect circuit includes: a first input port referenced to a first supply voltage node and a second input port referenced to a second supply voltage node. The circuit simultaneously monitors both ports for transitions, and once a transition occurs, directly generates the translated control signals at its output. Once a transition occurs at the inputs, the translated control signal is generated at the output within at most two gate delays. The circuit has very low quiescent current.

9 Claims, 2 Drawing Sheets

CIRCUIT FOR DETECTING TRANSITIONS ON EITHER OF TWO SIGNAL LINES REFERENCED AT DIFFERENT POWER SUPPLY LEVELS

This application claims priority under 35 USC § 119 (e) (1) of provisional application No. 60/683,927 filed May 25, 2005.

FIELD OF THE INVENTION

The present invention relates to electronic circuitry and, in particular, to a circuit for detecting transitions on either of two signal lines referenced at different power supply levels.

BACKGROUND OF THE INVENTION

In circuits such as bidirectional voltage translators where voltage translation is performed from an A port to a B port and vice versa, there is a need to detect transitions (e.g. high to low) at either port and then force the opposite port to the corresponding state. In general, the two signal lines being monitored will be referenced to different supply voltages (e.g. A port to 1.8V and B port to 5.0V). Once a transition occurs at either port, an internal logic signal must be generated, translated, and then used in driving the opposite port to the corresponding voltage level (completing the translation of the signal). In order to meet current market needs, the detection/translation circuit must have very low delay (on the order of 1 ns) and very low quiescent current (on the order of 0.5 uA)

Prior art circuits consume tens or hundreds of microamps of static supply current and/or have longer delay. Prior art circuits are shown in FIGS. 1 and 2. The prior art circuit shown in FIG. 1 is one half of a total detect/translate circuit. The circuit includes transistors MPa, MPb, MNa, and MNb; inverter INV; B-port Trigger Signal referenced to supply voltage VCCB of, for example, 5.0V; A-port Trigger Signal referenced to supply voltage VCCA of, for example, 1.8V; and output low-to-high. The prior art circuit shown in FIG. 2 is one fourth of a total detect/translate circuit. The circuit includes transistors MPc, MNc, MNd, MNe; inverter INV; resistor R1 of, for example, on the order of 100K ohms; B-port monitor; A-port Trigger Signal referenced to supply voltage VCCA of, for example, 1.8V; supply voltage VCCB; output A_low_to_high; and enable node EN. Neither of the prior art circuits has a true level translator in the path and as a result they consume much more dynamic ICC. An alternate approach would be to just translate the A signal to B levels before going into the transition detect circuit, but this method adds far too much delay to achieve the desired switching frequency across all the voltage combinations.

SUMMARY OF THE INVENTION

A transition detect circuit includes: a first input port referenced to a first supply voltage node and a second input port referenced to a second supply voltage node. The circuit simultaneously monitors both ports for transitions, and once a transition occurs, directly generates the translated control signals at its output. Once a transition occurs at the inputs, the translated control signal is generated at the output within at most two gate delays. The circuit has very low quiescent current.

DETAILED DESCRIPTION OF PREFERRED EMBODIMENTS

Figure 1:
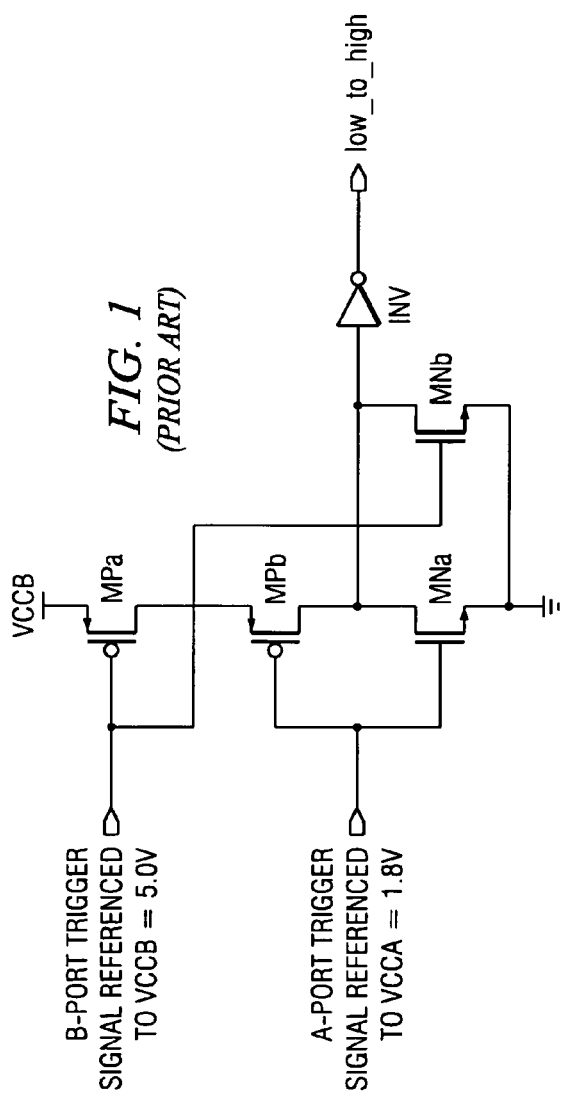
FIG. 1 is a circuit diagram of a portion of a prior art transition detect circuit.
Figure 2:
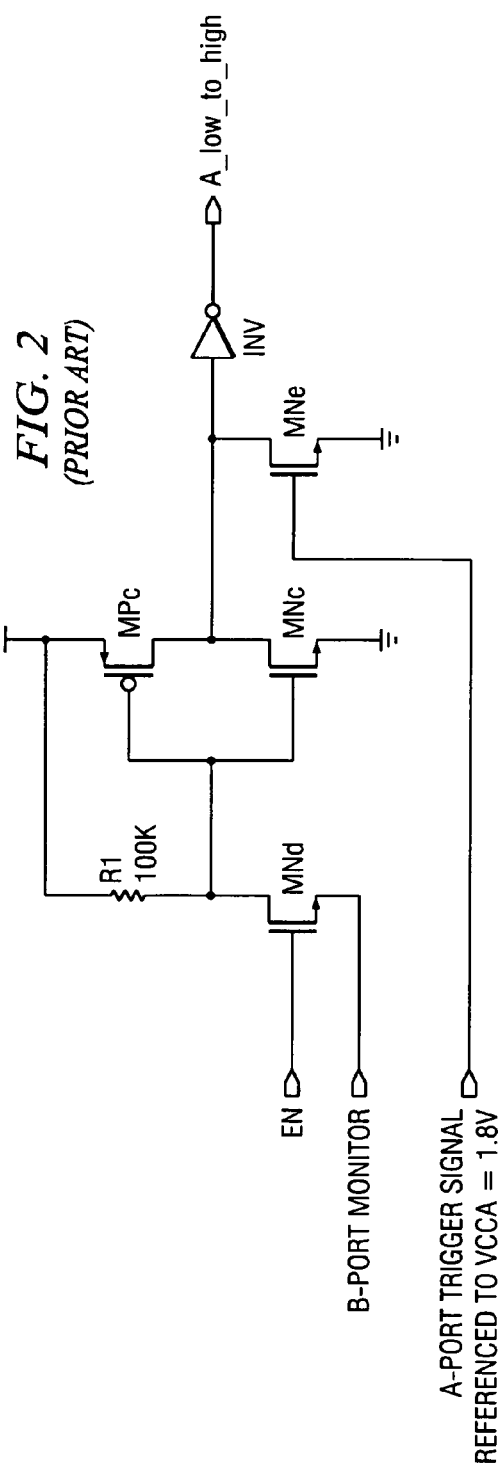
FIG. 2 is a circuit diagram of a portion of a prior art transition detect circuit.
Figure 3:
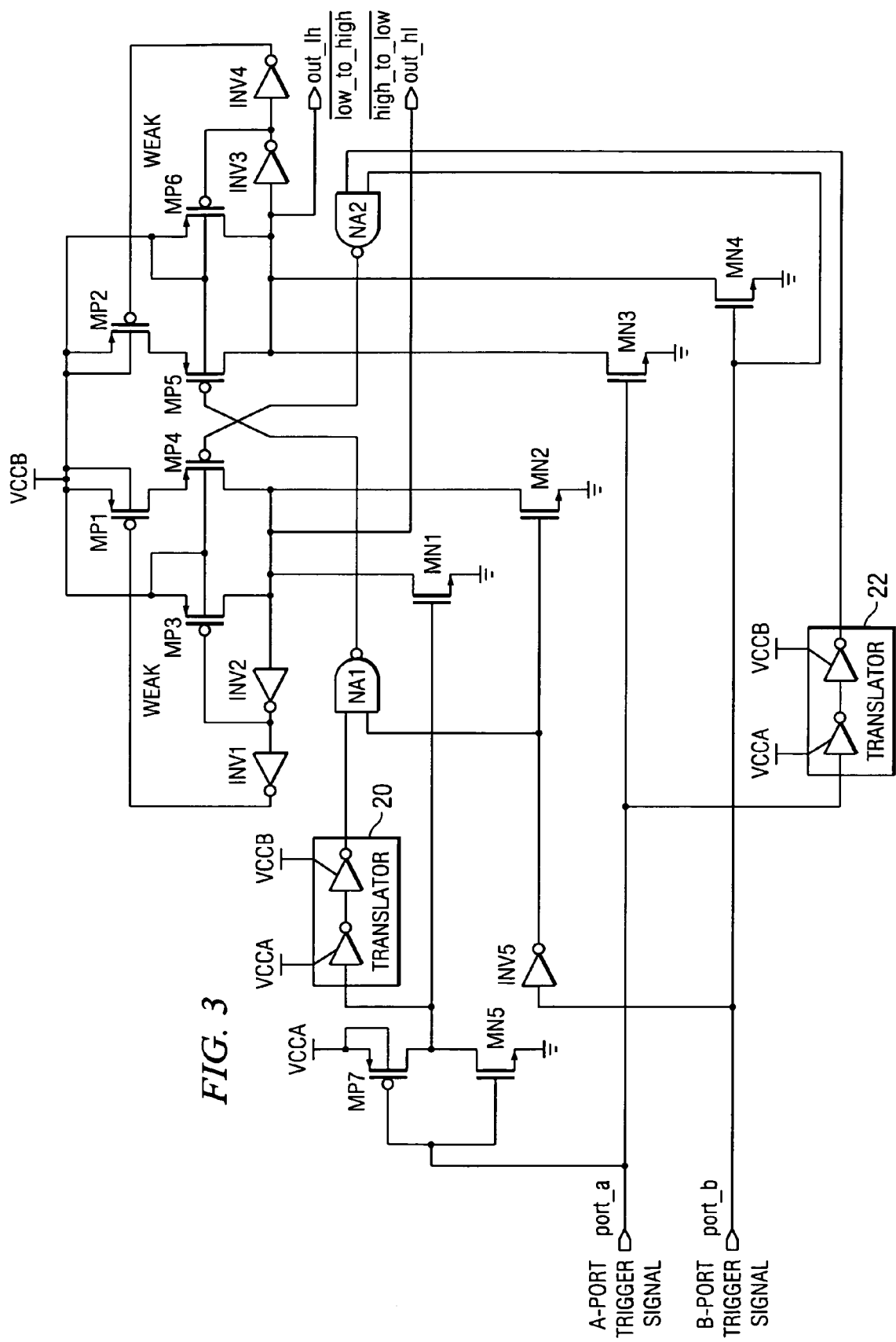
FIG. 3 is a circuit diagram of a preferred embodiment transition detect circuit.

A preferred embodiment transition detect circuit is shown in FIG. 3. The circuit of FIG. 3 includes transistors (switches) MP1–MP7 and MN1–MN5; level translators 20 and 22; NAND gates NA1 and NA2; inverters INV1–INV5; A-port Trigger Signal at node port_a; B-port Trigger Signal at node port_b; power supply voltages VCCA and VCCB; low-to-high output at node out_lh; and high-to-low output at node out_hl. Transistors MP7 and MN5 form an inverter. Inverters INV1 and INV2 form a feedback path from node out_hl to the control node of transistor MP1. Inverters INV3 and INV4 form a feedback from node out_lh to the control node of transistor MP2. The transition detect circuit of FIG. 3 provides the necessary functionality while achieving both low delay and low power. It does so by simultaneously monitoring both ports (port_a and port_b) for transitions, and once a transition occurs, directly generating the translated control signals at its output.

Referring to FIG. 3: signals on nodes port_a and port_b are inputs to the circuit and signals on nodes out_lh and out_hl are outputs from the circuit. The signal on node port_a is referenced to supply voltage VCCA, while node port_b, node out_lh, and node out_hl are referenced to supply voltage VCCB. First assume that nodes port_a and port_b are both initially low. The output signals of the circuit at nodes out_hl and out_lh will be low and high respectively. If node port_a is forced low-to-high by an external signal, transistor MN3 (switch) will turn on, overdrive transistor MP6 (weak transistor) and pull node out_lh low. Assume the node out_lh control signal is used to control external logic that will force node port_b to follow node port_a's transition form low to high. In that case, transistor MN2 (switch) will turn off and node out_hl will be forced high by the combination of transistors MP1 and MP4. The circuit is now in its other steady state condition with nodes port_a, port_b, and out_hl high and node out_lh low. Circuit operation for the other combinations of transitions on nodes port_a and port_b can be similarly derived. The key advantages are that once a transition occurs at the inputs, (1) the translated control signal is generated at the output within at most two gate delays and (2) the circuit has very low quiescent current (MOS off-state leakage only).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A transition detect circuit comprising:
   a first input port referenced to a first supply voltage node;
   a second input port referenced to a second supply voltage node;

a first switch coupled to a first output node and having a control node coupled to the first input port;
a second switch coupled to a first output node and having a control node coupled to the second input port;
a third switch coupled to a second output node and having a control node coupled to the first input port through an inverter;
a fourth switch coupled to a second output node and having a control node coupled to the second input port through an inverter;
a fifth switch coupled to the first output node;
a sixth switch coupled between the fifth switch and the second supply voltage node;
a seventh switch coupled to the second output node;
an eighth switch coupled between the seventh switch and the second supply voltage node;
a first feedback path from the first output node to a control node of the sixth switch; and
a second feedback path from the second output node to a control node of the eighth switch.

2. The circuit of claim 1 wherein the first feedback path comprises two inverters.

3. The circuit of claim 1 wherein the second feedback path comprises two inverters.

4. The circuit of claim 1 further comprising:
a ninth switch coupled between the second supply voltage node and the first output node, and having a control node coupled to the first feedback path; and
a tenth switch coupled between the second supply voltage node and the second output node, and having a control node coupled to the second feedback path.

5. The circuit of claim 4 wherein the first feedback path comprises:
a first inverter coupled between the first output node and the control node of the ninth switch; and
a second inverter coupled between the first inverter and the control node of the sixth switch.

6. The circuit of claim 4 wherein the second feedback path comprises:
a first inverter coupled between the second output node and the control node of the tenth switch; and
a second inverter coupled between the first inverter and the control node of the eighth switch.

7. The circuit of claim 1 further comprising:
a first logic gate having a first input coupled to the first input port through a first inverter and a second input coupled to the second input port through a second inverter, and having an output coupled to a control node of the fifth switch; and
a second logic gate having a first input coupled to the first input port and a second input coupled to the second input port, and having an output coupled to a control node of the seventh switch.

8. The circuit of claim 7 wherein the first and second logic gates are NAND gates.

9. The circuit of claim 7 further comprising:
a first voltage translator coupled between the first input port and the first input of the first logic gate; and
a second voltage translator coupled between the first input port and the first input of the second logic gate.

* * * * *